United States Patent
Xu et al.

(10) Patent No.: US 10,168,040 B2
(45) Date of Patent: Jan. 1, 2019

(54) DIMMING DEVICE AND DRIVING AND DIMMING DEVICE HAVING A DETACHABLE CONNECTOR FOR CONNECTING TO A CONNECTOR OF ANOTHER DEVICE

(71) Applicant: OPPLE LIGHTING CO., LTD., Shanghai (CN)

(72) Inventors: Xingxing Xu, Shanghai (CN); Shiwei Yu, Shanghai (CN); Lei Zheng, Shanghai (CN); Zhuang Zuo, Shanghai (CN); Jianlin Xu, Shanghai (CN); Mingxing Zhou, Shanghai (CN); Huiqing Duan, Shanghai (CN)

(73) Assignee: OPPLE LIGHTING CO., LTD., Shanghai (CN)

( * ) Notice: Subject to any disclaimer, the term of this patent is extended or adjusted under 35 U.S.C. 154(b) by 0 days.

(21) Appl. No.: 15/611,491

(22) Filed: Jun. 1, 2017

(65) Prior Publication Data
US 2017/0268760 A1    Sep. 21, 2017

Related U.S. Application Data

(63) Continuation of application No. PCT/CN2015/000841, filed on Dec. 2, 2015.

(30) Foreign Application Priority Data

Dec. 12, 2014  (CN) .......................... 2014 1 0768603
Dec. 12, 2014  (CN) ..................... 2014 2 0788170 U

(51) Int. Cl.
*F21V 23/04* (2006.01)
*F21V 23/00* (2015.01)
(Continued)

(52) U.S. Cl.
CPC .......... *F21V 23/0435* (2013.01); *F21V 23/00* (2013.01); *F21V 23/06* (2013.01);
(Continued)

(58) Field of Classification Search
CPC ... H05K 5/0017; H05K 5/0217; H05K 5/0247
(Continued)

(56) References Cited

U.S. PATENT DOCUMENTS 8,626,318 B2   1/2014  Wu
8,931,918 B2   1/2015  Liu et al.
(Continued)

FOREIGN PATENT DOCUMENTS

CN    101658068 A    2/2010
CN    101737654 A    6/2010
(Continued)

OTHER PUBLICATIONS

International Search Report (including English translation) issued in corresponding International Application No. PCT/CN2015/000841, dated Mar. 8, 2016, 8 pages.
(Continued)

*Primary Examiner* — Thuy Vinh Tran
(74) *Attorney, Agent, or Firm* — Arch & Lake LLP

(57) ABSTRACT

The present disclosure provides a dimming device and a driving and dimming device, where the dimming device includes a communication unit, a microcontrol unit, a power supply unit and a connector, and the power supply unit is input with a mains voltage and outputs a voltage required by the communication unit, the communication unit receives a control signal obtained by wired or wireless transmission and outputs the control signal to the microcontrol unit, the microcontrol unit outputs a dimming signal for dimming, and the connector is detachably connected with a connector of another device.

14 Claims, 2 Drawing Sheets

(51) Int. Cl.
    *H05B 37/02*   (2006.01)
    *F21V 23/06*   (2006.01)
    *H05K 5/02*    (2006.01)
    *H05K 5/00*    (2006.01)
    *F21Y 115/10*  (2016.01)

(52) U.S. Cl.
    CPC ......... *H05B 37/02* (2013.01); *H05B 37/0245* (2013.01); *H05B 37/0272* (2013.01); *F21Y 2115/10* (2016.08); *H05K 5/0017* (2013.01); *H05K 5/0217* (2013.01); *H05K 5/0247* (2013.01)

(58) Field of Classification Search
    USPC ..... 361/600, 679.01, 728–730; 439/386, 577
    See application file for complete search history.

(56)              References Cited

U.S. PATENT DOCUMENTS

| 2002/0158591 | A1* | 10/2002 | Ribarich | ............ H05B 37/0254 |
| | | | | 315/291 |
| 2010/0060194 | A1 | 3/2010 | Furry et al. | |
| 2010/0118148 | A1 | 5/2010 | Lee | |
| 2012/0215325 | A1 | 8/2012 | Wu | |
| 2013/0215609 | A1 | 8/2013 | Liu et al. | |
| 2015/0084503 | A1 | 3/2015 | Liu et al. | |
| 2016/0165702 | A1* | 6/2016 | Lai | ..................... H05B 37/0272 |
| | | | | 315/201 |

FOREIGN PATENT DOCUMENTS

| CN | 102647821 | A | 8/2012 |
| CN | 102679190 | A | 9/2012 |
| CN | 103604097 | A | 2/2014 |
| CN | 103716948 | A | 4/2014 |
| CN | 104456475 | A | 3/2015 |
| CN | 204268416 | U | 4/2015 |
| JP | 2012014967 | A | 1/2012 |

OTHER PUBLICATIONS

Written Opinion issued in corresponding International Application No. PCT/CN2015/000841, dated Mar. 8, 2016, 5 pages.
Japanese Office Action (including English translation) in corresponding JP Patent Application No. 201410768603.6 dated Jun. 28, 2016, 8 pages.

* cited by examiner

DIMMING DEVICE AND DRIVING AND DIMMING DEVICE HAVING A DETACHABLE CONNECTOR FOR CONNECTING TO A CONNECTOR OF ANOTHER DEVICE

CROSS-REFERENCE TO RELATED APPLICATIONS

This application is based upon and claims the priority of PCT patent application No. PCT/CN2015/000841 filed on Dec. 2, 2015 which claims the priorities of Chinese Patent Application Nos. 201410768603.6 filed on Dec. 12, 2014 and 201420788170.6 filed on Dec. 12, 2014, the entire contents of all of which are hereby incorporated by reference herein for all purposes.

TECHNICAL FIELD

The present disclosure relates to a dimming device and a driving and dimming device.

BACKGROUND

When light-emitting diodes (LEDs) are widely applied in lighting fixtures, people can control and manage lighting. Dimming devices may be added into lighting fixtures to adjust the intensity, color, color temperature and the like of light emitted by the lighting fixture. The dimming device may be integrated into the lighting fixture. However, different drive power supplies and dimming devices are designed for different lighting fixtures, resulting in waste of manpower and material resources.

SUMMARY

The present disclosure provides a dimming device, a driving and dimming device and a dimming method.

The present disclosure provides a dimming device. The dimming device may include a communication unit; a microcontrol unit; a power supply unit and a connector; and where: the power supply unit may be input with a mains voltage and may output a voltage required by the communication unit, the communication unit may receive a control signal obtained by wired or wireless transmission and may output the control signal to the microcontrol unit, the microcontrol unit may output a dimming signal for dimming, and the connector may be detachably connected with a connector of another device.

The present disclosure provides a driving and dimming device. The device may include a driving device and a dimming device, where the dimming device may include a first connector, the driving device may include a second connector, the first connector and the second connector may be detachably connected with each other, the dimming device may include a communication unit, a microcontrol unit and a power supply unit, the power supply unit may be input with a mains voltage and may output a voltage required by the communication unit, the communication unit may receive a control signal obtained by wired or wireless transmission and may output the control signal to the microcontrol unit, and the microcontrol unit may output a dimming signal for dimming.

The present disclosure provides a dimming method. The method may include inputting a mains voltage to a power supply unit, and outputting a voltage required by a communication unit; receiving, by the communication unit, a control signal obtained by wired or wireless transmission, and outputting the control signal to a microcontrol unit; outputting, by the microcontrol unit, a dimming signal for dimming; and detachably connecting one connector with another connector of another device.

It should be understood that both the foregoing general description and the following detailed description are only exemplary and explanatory and are not restrictive of the disclosure.

BRIEF DESCRIPTION OF THE DRAWINGS

The accompanying drawings herein are incorporated in and become parts of the specification, illustrate embodiments consistent with the disclosure and, together with the description, serve to explain the principles of the disclosure.

Figure 1:
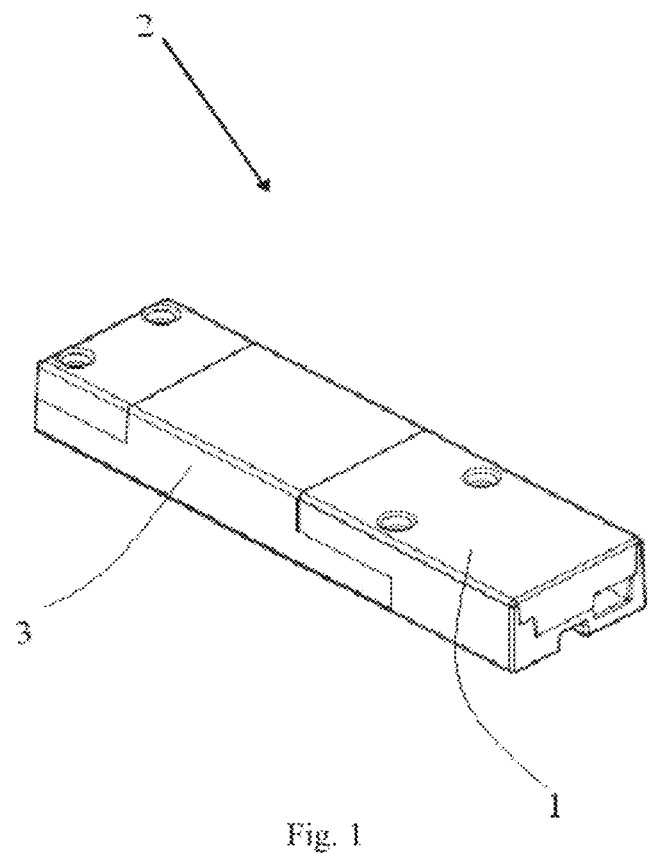
FIG. 1 is a perspective view of a preferred embodiment of a driving and dimming device provided by the present disclosure.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

The Chinese Patent Application Publication No. CN102647821A discloses a lighting fixture, which is controlled by a control terminal and may include a luminous element module, a driving circuit for driving the luminous element module, a microcontrol unit for controlling the working period of the driving circuit, a first connector electrically coupled with the microcontrol unit, and a communication module. The communication module includes a second connector which is in butt joint with the first connector in a pluggable manner and is configured to receive a control instruction from the control terminal and transmit the control instruction to the microcontrol unit, so as to control the driving circuit according to the control instruction. In view of this, when the control terminal replaces a new communication protocol, only corresponding communication module is required to be replaced but the lighting fixture is not required to be replaced. However, in the technical proposal, the microcontrol module is matched with different communication modules each time when connected with the communication module each time, so the microcontrol module can be complex, and hence the cost can be increased. Therefore, an improved driving and dimming device is provided in this disclosure.

Figure 2:
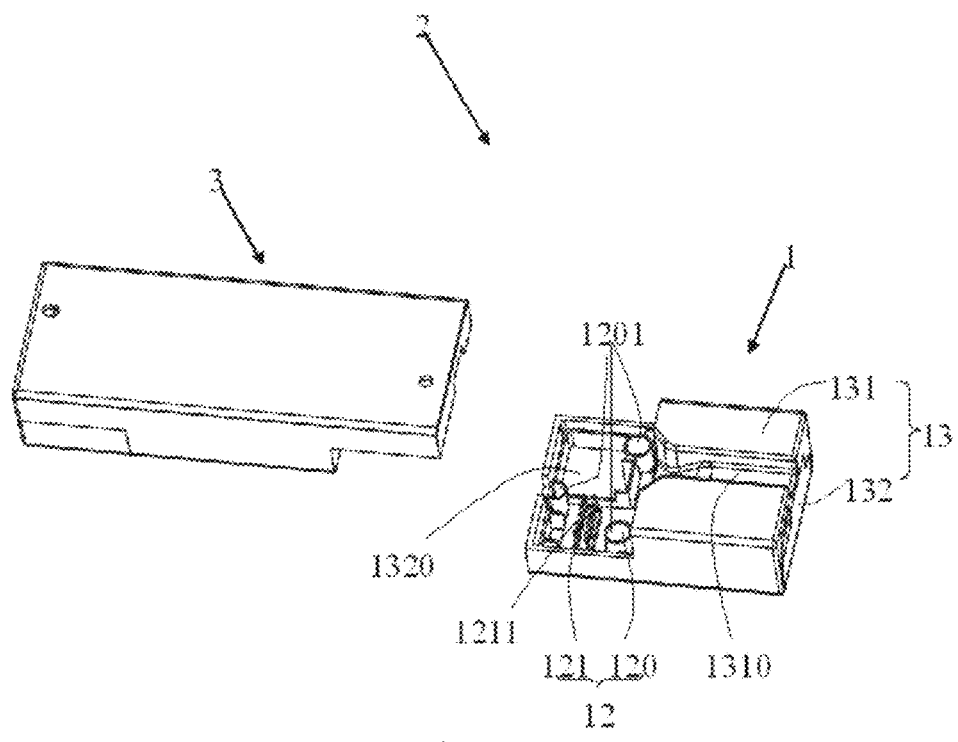
FIG. 2 is a perspective exploded view of a driving device and a dimming device in a preferred embodiment of the driving and dimming device provided by the present disclosure.

The present disclosure provides a dimming device. As illustrated in FIG. 2, the dimming device 1 provided by the preferred embodiment of the present disclosure may include a communication unit (not illustrated in the figure), a microcontrol unit (not illustrated in the figure), a power supply unit (not illustrated in the figure) and a first connector 12. The power supply unit is input with the mains voltage and outputs the voltage required by the communication unit; the communication unit receives a control signal obtained by wired or wireless transmission and outputs the control signal to the microcontrol unit; the microcontrol unit outputs a dimming signal for dimming; and the first connector 12 is detachably connected with a connector (not illustrated in the figure) of another device (not illustrated in the figure). As the dimming device 1 is provided with the power supply unit, the dimming device 1 can have direct access to the mains voltage, and voltage conversion is performed inside the dimming device 1, so that the overall structure can be more compact. The first connector 12 is detachably connected with other devices, so that the dimming device 1 can be conveniently replaced. The communication unit may be a communication unit for receiving wireless signals and may also be a communication unit for receiving wired signals. The communication unit for receiving the wireless signals may be configured to receive wireless signals on the basis of different standards as required. When it is needed to receive a certain wireless signal, only the dimming device 1 comprising corresponding communication unit is required to be replaced. The structure can improve the consistency of other jointing devices, so that different dimming devices 1 can be matched with the same jointing device. And only different dimming devices 1 are required to be replaced according to different demands. Thus, the cost can be saved, and the production and installation processes can be simple and convenient.

The first connector 12 includes a mechanical connecting part 120 and an electrical connecting part 121. The mechanical connecting part 120 and the electrical connecting part 121 are separate from each other. The mechanical connecting part 120 includes a plurality of hollow connecting posts 1201 which are arranged in a triangle, and the connecting posts 1201 are in butt joint with a mechanical connecting part (not illustrated in the figure) of a connector of another device. The electrical connecting part 121 includes a plurality of conductive parts 1211 which are acicular and arranged in two rows. In the embodiment, the number of the conductive parts 1211 is 10, including at least two power input terminals (not marked), two dimming signal output terminals (not marked), one ground terminal (not marked), one light source status signal terminal (not marked) and one power-off signal terminal configured to feed back power-off signals. The case that the power-off signal terminal feeds back the power-off signals may be set to have different applications as required. For example, the brightness of light is controlled by the frequency of feeding back the power-off signal. The remaining three terminals are reserving terminals. In other embodiments, the number and the settings of the terminals may also be changed as required. The conductive parts 1211 in the embodiment are exposed conductive terminals. In other embodiments, the conductive parts may also be electrical conductors or other conductive structures disposed in an insulation shell (not illustrated in the figure), and the mechanical connecting part 120 may also be other fasteners, etc.

The dimming device 1 further may include a housing 13, and the communication unit, the microcontrol unit and the power supply unit are disposed in the housing 13. The housing 13 includes a first housing 131 and a second housing 132; the first housing 131 and the second housing 132 are assembled to form a first accommodating cavity (not marked); the length of the first housing 131 is less than that of the second housing 132; a part of the second housing 132 longer than the first housing 131 is provided with a second accommodating cavity 1320; the communication unit, the microcontrol unit and the power supply unit are disposed in the first accommodating cavity encircled by the first housing 131 and the second housing 132; and the first connector 12 is disposed in the second accommodating cavity 1320.

The first housing 131 is provided with a channel 1310, disposed on an exterior surface and extended along the longitudinal direction of the first housing, so as to provide a passage for a lead (not illustrated in the figure) to run through.

Figure 3:
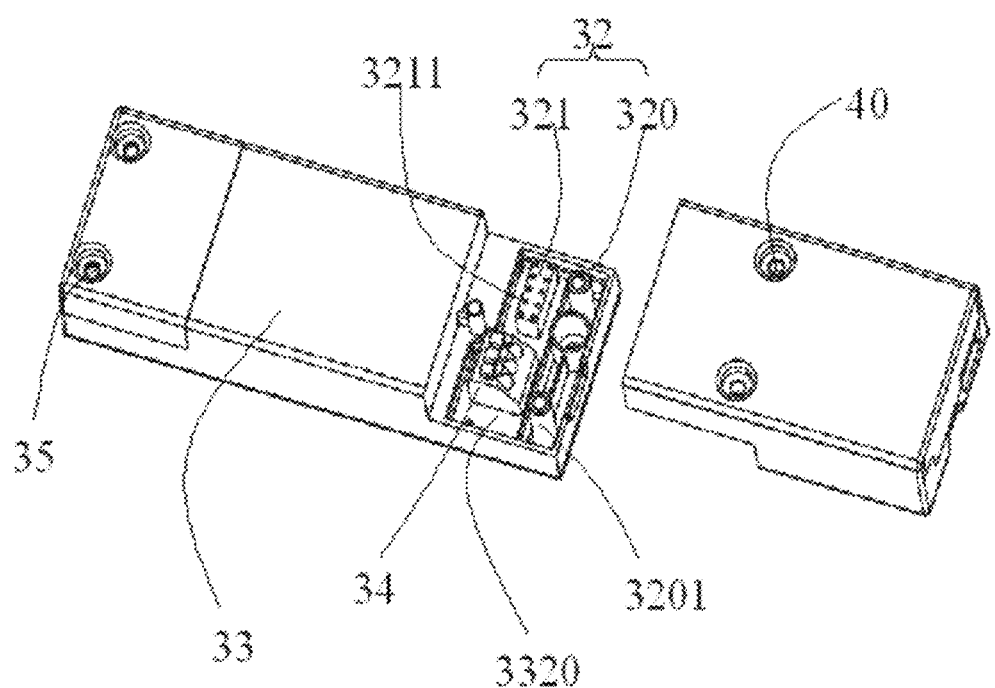
FIG. 3 is a perspective exploded view of FIG. 2 from another viewing angle.

The present disclosure further provides a driving and dimming device. As illustrated in FIGS. 1 to 3, the driving and dimming device 2 provided by the preferred embodiment of the present disclosure may include a driving device 3 and a dimming device 1; the dimming device 1 includes a first connector 12; the driving device 3 includes a second connector 32; and the first connector 12 and the second connector 32 are detachably connected with each other. The dimming device 1 includes a communication unit (not illustrated in the figure), a microcontrol unit (not illustrated in the figure) and a power supply unit (not illustrated in the figure); the power supply unit is input with the mains voltage and outputs the voltage required by the communication unit; the communication unit receives a control signal obtained by wired or wireless transmission and outputs the control signal to the microcontrol unit; and the microcontrol unit outputs a dimming signal for dimming. As the dimming device 1 includes the power supply unit, the dimming device 1 can have direct access to the mains voltage, and voltage conversion is performed inside the dimming device 1, so that the overall structure can be more compact. The first connector 12 is detachably connected with the second connector 32 of the driving device 3, so that the dimming device 1 can be conveniently replaced. The communication unit may be a communication unit for receiving wireless signals and may also be a communication unit for receiving wired signals. The communication unit for receiving the wireless signals may be configured to receive wireless signals on the basis of different standards as required. When it is needed to receive a certain wireless signal, only the dimming device 1 including corresponding communication unit is required to be replaced. The structure can improve the consistency of the driving device 3, so that different dimming devices 1 can be matched with the same driving device 3. And only different dimming devices 1 are required to be replaced according to different demands. Thus, the cost can be saved, and the production and installation processes can be simple and convenient.

The second connector 32 includes a mechanical connecting piece 320 and an electrical connecting piece 321 corresponding to the mechanical connecting part 120 and the electrical connecting part 121.

The mechanical connecting piece 320 of the second connector 32 includes butt joint posts 3201 corresponding to the connecting posts 1201; the diameter of the connecting posts 1201 is greater than that of the butt joint posts 3201, or the diameter of the butt joint posts 3201 is greater than that of the connecting posts 1201; and the connecting posts 1201/the butt joint posts 3201 are inserted into the butt joint posts 3201/the connecting posts 1201 by interference fit. In the embodiment, in order to more firmly connect the first connector 12 and the second connector 32, the connecting posts 1201 or the butt joint posts 3201 of the first connector 12 or the second connector 32 are also provided with screws 40, and the first connector 12 and the second connector 32 are more firmly connected by allowing bolts (not illustrated in the figure) to run through the screws 40. In other embodiments, the bolts may also be not used, and the connecting posts 1201 and the butt joint posts 3201 may also be not used, but other fastening modes are adopted.

The electrical connecting piece 321 of the second connector 32 is an electrical connector socket; the electrical connecting piece 321 includes a plurality of through holes 3211 corresponding to the conductive parts 1211; each through hole 3211 is provided with a conductive element (not illustrated in the figure) in butt joint with corresponding conductive part 1211; and the conductive part 1211 is inserted into the through hole 3211, so as to be electrically connected with the conductive element in the through hole 3211. In other embodiments, the case may also be that the first connector 12 includes an electrical connector socket and the second connector includes conductive parts 1211, and the electrical connecting piece 321 and the conductive parts 1211 may also be not the structure of the through holes 3211 and the terminals and may adopt other electrical connection structures as required. For example, the structure of the butt joint of golden fingers (not illustrated in the figure) and slots (not illustrated in the figure) in a printed circuit board (PCB).

The driving device 3 further includes a shell 33; the shell 33 is provided with an accommodating space 3320 corresponding to the second accommodating cavity 1320 of the first housing 13 at position; and the second connector 32 is disposed in the accommodating space 3320. The shell 33 and the housing 13 are assembled to form a rectangle.

The driving device 3 further includes a load connector 34, and the load connector 34 and the second connector 32 are disposed on the same side of the driving device 3. The load connector 34 is configured to connect a load, e.g., a light source. In the embodiment, the load connector 34 is connected with the load through a lead (not illustrated in the figure), and the lead runs out of the driving and dimming device 2 through the channel 1310 of the first housing 131.

The driving device 3 further includes a third connector 35. The third connector 35 is connected with an external power source (not illustrated in the figure) and disposed on a side of the driving device opposite to the second connector 32.

The present disclosure may include dedicated hardware implementations such as application specific integrated circuits, programmable logic arrays and other hardware devices. The hardware implementations can be constructed to implement one or more of the methods described herein. Applications that may include the apparatus and systems of various examples can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the computing system disclosed may encompass software, firmware, and hardware implementations. The terms "module," "sub-module," "unit," or "sub-unit" may include memory (shared, dedicated, or group) that stores code or instructions that can be executed by one or more processors.

In order to achieve the above objective, the present disclosure may adopt the following technical proposal: a dimming device, comprising a communication unit, a microcontrol unit, a power supply unit and a connector, wherein the power supply unit is input with a mains voltage and outputs a voltage required by the communication unit; the communication unit receives a control signal obtained by wired or wireless transmission and outputs the control signal to the microcontrol unit; the microcontrol unit outputs a dimming signal for dimming; and the connector is detachably connected with a connector of another device.

Preferably, the connector may include a mechanical connecting part and an electrical connecting part.

Preferably, the mechanical connecting part and the electrical connecting part are separate from each other.

Preferably, the mechanical connecting part may include a plurality of connecting posts; and the connecting posts are in butt joint with a mechanical connecting part of the connector of another device.

Preferably, the electrical connecting part may include a plurality of conductive parts.

Preferably, the conductive parts include at least two power input terminals, two dimming signal output terminals, one ground terminal and one light source status signal terminal.

Preferably, the conductive parts include a power-off signal terminal which is configured to feedback power-off signals.

Preferably, the dimming device further may include a housing; and the communication unit, the microcontrol unit and the power supply unit are disposed in the housing.

Preferably, the housing may include a first housing and a second housing; the first housing and the second housing are assembled to form a first accommodating cavity; the first housing is smaller than the second housing; a part of the second housing greater than the first housing is provided with a second accommodating cavity; the communication unit, the microcontrol unit and the power supply unit are disposed in the first accommodating cavity encircled by the first housing and the second housing; and the connector is disposed in the second accommodating cavity.

Preferably, the first housing is provided with a channel so as to provide a passage for a lead to run through.

Compared with the prior art, the dimming device according to the present disclosure has the advantages such as simple structure and convenient replacement.

An objective of the present disclosure is to provide a driving and dimming device.

In order to achieve the above objective, the present disclosure adopts the following technical proposal: a driving and dimming device, comprising a driving device and a dimming device, wherein the dimming device may include a first connector; the driving device may include a second connector; the first connector and the second connector are detachably connected with each other; the dimming device may include a communication unit, a microcontrol unit and a power supply unit; the power supply unit is input with a mains voltage and outputs a voltage required by the communication unit; the communication unit receives a control signal obtained by wired or wireless transmission and outputs the control signal to the microcontrol unit; and the microcontrol unit outputs a dimming signal for dimming.

Preferably, the first connector may include a mechanical connecting part and an electrical connecting part which are separate from each other; and the second connector may include a mechanical connecting piece and an electrical connecting piece corresponding to the mechanical connecting part and the electrical connecting part of the first connector.

Preferably, the mechanical connecting part of the first connector may include a plurality of connecting posts; the mechanical connecting piece of the second connector may include butt joint posts corresponding to the connecting posts; the diameter of the connecting post is greater than that of the butt joint post, or the diameter of the butt joint posts is greater than that of the connecting posts; and the connecting posts/the butt joint posts are inserted into the butt joint posts/the connecting posts by interference fit.

Preferably, the electrical connecting part of the first connector may include a plurality of conductive parts or an electrical connector socket; the electrical connecting piece of the second connector may include an electrical connector socket or a plurality of conductive parts; the electrical connector socket may include a plurality of through holes corresponding to the conductive parts; each through hole is provided with a conductive element in butt joint with corresponding conductive part; and the conductive parts are inserted into the through holes so as to be electrically connected with the conductive element in the through holes.

Preferably, the dimming device further may include a housing; the housing may include a first housing and a second housing; the first housing and the second housing are assembled to form a first accommodating cavity; the first housing is smaller than the second housing; a part of the second housing greater than the first housing is provided with a second accommodating cavity; the communication unit, the microcontrol unit and the power supply unit are disposed in the first accommodating cavity encircled by the first housing and the second housing; and the connector is disposed in the second accommodating cavity.

Preferably, the driving device further include a shell; the shell is provided with an accommodating space corresponding to the second accommodating cavity of the first housing at position; and the second connector is disposed in the accommodating space.

Preferably, the shell and the housing are assembled to form a rectangle.

Preferably, the driving device further may include a load connector; and the load connector and the second connector are disposed on a same side of the driving device.

Preferably, the driving device also may include a third connector; and the third connector is connected with an external power source and disposed on a side of the driving device opposite to the second connector.

Compared with the prior art, the dimming device according to the present disclosure has the advantages such as simple structure and convenient replacement.

The present disclosure may also provide a dimming method. The method may include inputting a mains voltage to a power supply unit, and outputting a voltage required by a communication unit; receiving, by the communication unit, a control signal obtained by wired or wireless transmission, and outputting the control signal to a microcontrol unit; outputting, by the microcontrol unit, a dimming signal for dimming; and detachably connecting one connector with another connector of another device.

It should be noted that the embodiments of the present disclosure have preferred embodiments and are not intended to limit the present disclosure in any form. Equivalent embodiments may be changed or modified by those skilled in the art on the basis of the technical content disclosed above. But any modification or equivalent changes and modifications made to the above embodiments, on the basis of the technical essence of the present disclosure without departing from the content of the technical proposals of the present disclosure, shall still fall within the scope of the technical proposals of the present disclosure.

What is claimed is:

1. A dimming device for dimming a light source, comprising:
    a first device and a second device, wherein the first device and the second device are detachably connected with each other, the first device comprises a first connector and the second device comprises a second connector, and the first connector is detachably connected to the second connector for dimming the light source, wherein the first connector comprises a mechanical connecting part and an electrical connecting part, and the electrical connecting part of the first connector comprises a plurality of conductive parts, wherein the plurality of conductive parts comprise at least two power input terminals, two dimming signal output terminals, one ground terminal and one light source status signal terminal.

2. The dimming device according to claim 1, wherein the mechanical connecting part of the first connector and the electrical connecting part of the first connector are separate from each other.

3. The dimming device according to claim 1, wherein the mechanical connecting part comprises a plurality of connecting posts; and the connecting posts are in butt joint with a mechanical connecting part of the second connector of the second device.

4. The dimming device according to claim 1, wherein the dimming device further comprises a housing.

5. The dimming device according to claim 4, wherein the housing comprises a first housing and a second housing, the first housing and the second housing are assembled to form a first accommodating cavity, the first housing is smaller than the second housing, a part of the second housing greater than the first housing is provided with a second accommodating cavity, and the first connector is disposed in the second accommodating cavity.

6. The dimming device according to claim 5, wherein the first housing is provided with a channel so as to provide a passage for a lead to run through.

7. A driving and dimming device for dimming a light source, comprising:
a driving device and a dimming device;
wherein the dimming device comprises a first connector, the driving device comprises a second connector, the first connector and the second connector are detachably connected with each other;
wherein the first connector comprises a mechanical connecting part and an electrical connecting part which are separate from each other, and the second connector comprises a mechanical connecting piece and an electrical connecting piece corresponding to the mechanical connecting part and the electrical connecting part of the first connector and
wherein the mechanical connecting part of the first connector comprises a plurality of connecting posts, the mechanical connecting piece of the second connector comprises butt joint posts corresponding to the connecting posts, the diameter of the connecting posts is greater than that of the butt joint posts, or the diameter of the butt joint posts is greater than that of the connecting posts, and the connecting posts are inserted into the butt joint posts by interference fit.

8. The driving and dimming device according to claim 7, wherein the electrical connecting part of the first connector comprises a plurality of conductive parts, the electrical connecting piece of the second connector comprises an electrical connector socket; the electrical connector socket comprises a plurality of through holes corresponding to the conductive parts, each through hole is provided with a conductive element in butt joint with corresponding conductive part, and the conductive parts are inserted into the through holes so as to be electrically connected with the conductive element in the through holes.

9. The driving and dimming device according to claim 7, wherein the dimming device further comprises a housing, the housing comprises a first housing and a second housing, the first housing and the second housing are assembled to form a first accommodating cavity, the first housing is smaller than the second housing, a part of the second housing greater than the first housing is provided with a second accommodating cavity, and the first connector is disposed in the second accommodating cavity.

10. The driving and dimming device according to claim 9, wherein the driving device further comprise a shell, the shell is provided with an accommodating space corresponding to the second accommodating cavity of the first housing at position, and the second connector is disposed in the accommodating space.

11. The driving and dimming device according to claim 10, wherein the shell and the housing are assembled to form a rectangle.

12. The driving and dimming device according to claim 7, wherein the driving device further comprises a load connector, and the load connector and the second connector are disposed on a same side of the driving device.

13. The driving and dimming device according to claim 7, wherein the driving device further comprises a third connector, and the third connector is connected with an external power source and disposed on a side of the driving device opposite to the second connector.

14. The driving and dimming device according to claim 7, wherein the electrical connecting part of the first connector comprises an electrical connector socket, the electrical connecting piece of the second connector comprises a plurality of conductive parts; the electrical connector socket comprises a plurality of through holes corresponding to the conductive parts, each through hole is provided with a conductive element in butt joint with corresponding conductive part, and the conductive parts are inserted into the through holes so as to be electrically connected with the conductive element in the through holes.

* * * * *